United States Patent [19]
Gurley et al.

[11] Patent Number: 5,721,594
[45] Date of Patent: Feb. 24, 1998

[54] VIDEO DIFFERENTIAL BUS RECEIVER FOR AUDIO/VIDEO INTERCONNECTION

[75] Inventors: Thomas David Gurley, Indianapolis; Charles Michael White, Noblesville, both of Ind.

[73] Assignee: Thomson Consumer Electronics, Inc., Indianapolis, Ind.

[21] Appl. No.: 805,708

[22] Filed: Feb. 25, 1997

Related U.S. Application Data

[63] Continuation of Ser. No. 517,175, Aug. 21, 1995, abandoned.

[51] Int. Cl.$^6$ .................................................. H04N 5/14
[52] U.S. Cl. ..................................... 348/707; 348/705
[58] Field of Search ............................. 348/707, 706, 348/725, 678, 564, 565, 912, 705; 330/252, 254, 261

[56] References Cited

U.S. PATENT DOCUMENTS

| | | | |
|---|---|---|---|
| 4,575,759 | 3/1986 | Griepentrog et al. | 358/181 |
| 4,581,645 | 4/1986 | Beyers, Jr. | 358/181 |
| 4,647,973 | 3/1987 | Diess | 358/181 |
| 5,305,109 | 4/1994 | Harford | 348/707 |
| 5,448,311 | 9/1995 | White et al. | 348/707 |
| 5,473,390 | 12/1995 | Gurley et al. | 348/707 |

FOREIGN PATENT DOCUMENTS 0 146 910 A2  7/1985  European Pat. Off.  ....... H03K 19/94

*Primary Examiner*—Victor R. Kostak
*Attorney, Agent, or Firm*—Joseph S. Tripoli; Peter M. Emanuel; David T. Shoneman

[57] ABSTRACT

A differential transconductance amplifier having a fixed value of differential transconductance provides a video output signal current directly proportional to the transconductance of the amplifier and to a difference between first and second differential video input signals supplies thereto. A pair of buffer amplifiers couples the video input signals to respective inputs of the differential transconductance amplifier via respective diode switches which provides Vber protection for the buffer transistors and provides bus isolation under power down conditions. An output circuit regulates the output voltage of the differential transconductance amplifier at a substantially fixed voltage and converts the output signal current to an output signal voltage. Advantageously, the receiver provides very accurate signal gain control unconditional stability, a wide common mode input voltage range, avoids the need for stand-by power and will not load the input bus under power-down conditions.

9 Claims, 2 Drawing Sheets

VIDEO DIFFERENTIAL BUS RECEIVER FOR AUDIO/VIDEO INTERCONNECTION

This is a continuation of application Ser. No. 08/517,175 filed Aug. 21, 1995, now abandoned.

FIELD OF THE INVENTION

This invention relates to audio/video interconnection systems generally and particularly to differential video bus receivers suitable for use in such systems.

BACKGROUND OF THE INVENTION

Bus oriented bi-directional audio/video interconnection systems are known and used, for example, for interconnecting component audio/video apparatus such as video tape recorders, video disc players, television tuners, video cameras, video monitors and the like. In typical systems, a common bus containing control, audio and video signals is "daisy chained" between various equipment and driven by tri-state drivers so that the bus may be "shared", so to speak, by all of the connected audio/video units. Such a system is described, for example, by Beyers, Jr. in U.S. Pat. No. 4,581,645 entitled DISTRIBUTED SWITCHED COMPONENT AUDIO/VIDEO SYSTEM which issued Apr. 8, 1986.

More recently, the U.S. Electrical Industries Association (EIA) has considered standardization of audio, video and control interconnections for television apparatus. One standard under consideration proposes audio and video interconnection using twisted pair cables driven by tri-state balanced line drivers. Devices are connected in "daisy chain" fashion to the bus which is terminated with 120 Ohm loads at the first and last devices and with intermediate devices having relatively high impedance inputs connected for bridging operation. An example of such a system is described by White et al. in allowed U.S. application Ser. No. 08/294,146 entitled TRI-STATE VIDEO DIFFERENTIAL DRIVER filed 8 Aug. 1994.

Significant parameters of the video bus receiver portion of the proposed standard includes (i) an input impedance, with power on or off, of 3K Ohms from DC to 4 MHz, 1.5K Ohms plus or minus an amount as yet undetermined, from each line to a potential of 5.0 Volts plus or minus 0.5 Volts, (ii) a common mode voltage of 6.0 Volts, (iii) a common mode range, as yet undetermined, but believed to be on the order of plus or minus two volts or so, and (iv) a common mode rejection ratio (CMRR) of at least 35 dB at a frequency of 4 MHz.

To meet these requirements one might consider the use of conventional techniques such as providing a stand-by power supply or precision attenuation networks (to provide the desired bus isolation under power-down conditions) and selecting feedback controlled operational amplifiers to meet the gain and common mode requirements and to provide single-ended to differential conversion. However, combining such conventional techniques to meet the overall requirements for a video bus receiver can result an overall bus receiver design that may be prohibitively costly and overly complex for use in mass produced consumer products such as VCR's or television receivers.

SUMMARY OF THE INVENTION

A need exists for a simplified video bus receiver which does not require the use of stand-by supplies, precision networks or feedback controlled operational amplifiers. The present invention is directed to meeting such needs.

A video bus receiver, in accordance with the invention, includes a differential transconductance amplifier having a fixed value of transconductance for providing a video output signal current proportional to a difference between first and second differential video input signals supplied thereto. A pair of buffer amplifiers couples the video input signals to respective inputs of the differential transconductance amplifier via respective diode switches which provide bus isolation under power down conditions. An output circuit regulates the output voltage of the differential transconductance amplifier at a substantially fixed voltage and converts the output signal current to an output signal voltage.

BRIEF DESCRIPTION OF THE DRAWING

The foregoing and further features of the invention are shown in the accompanying drawing wherein like elements are denoted by like reference designators and in which.

Figure 1:
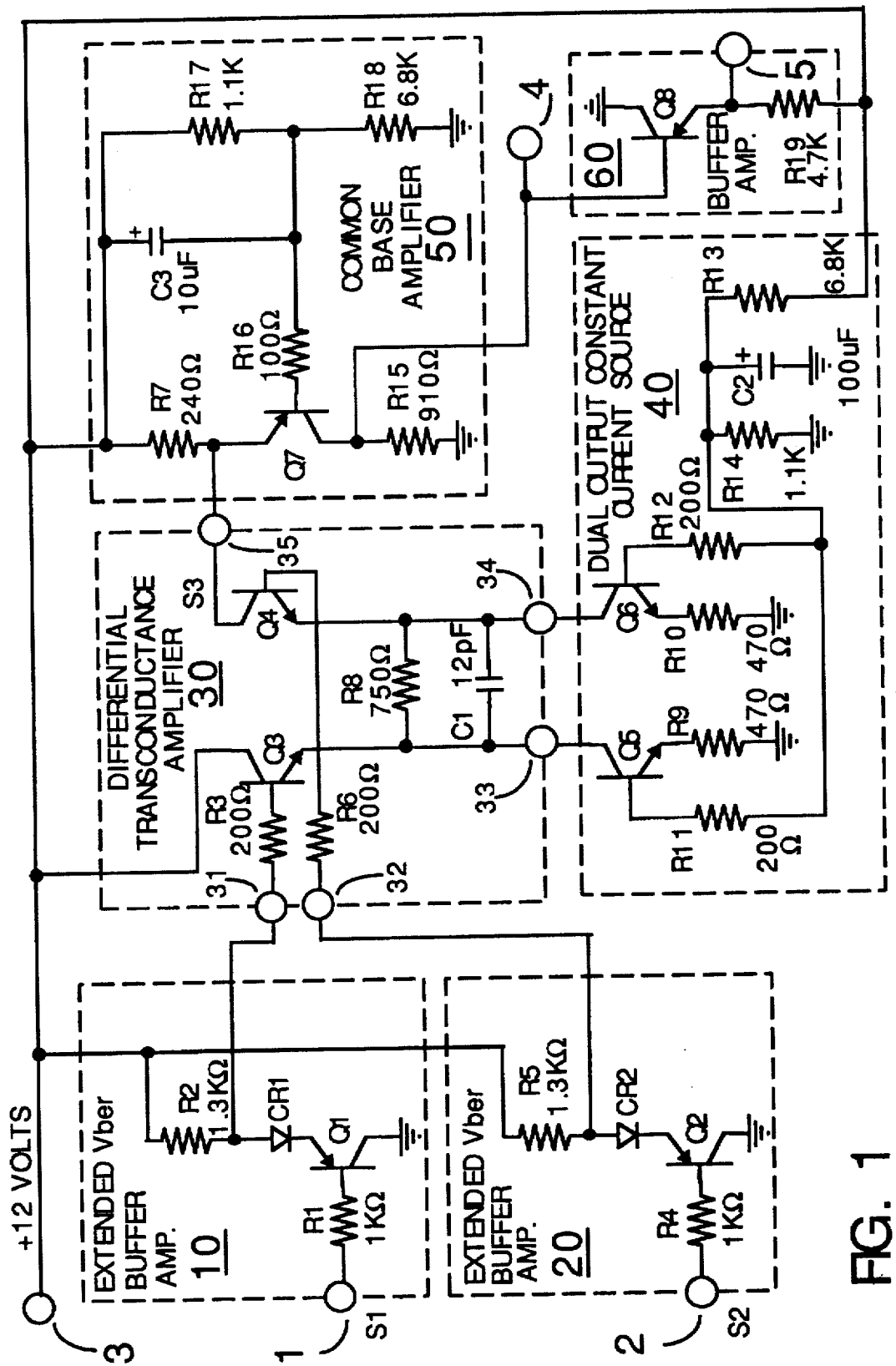
FIG. 1 is a detailed schematic diagram of a video differential bus receiver embodying the invention.

The drawing further includes exemplary element values for operation with a specific supply voltage of 12 volts. These values are given for purposes of illustration only. One may readily calculate other suitable values for a specific application of the principles of the invention.

DETAILED DESCRIPTION

The video bus receiver of FIG. 1 comprises a differential transconductance amplifier 30 having first and second inputs, 31 and 32, for receiving respective differential video input signals, having a fixed value of transconductance (illustratively, about 1300 micro-Mhos for the exemplary element values shown) and having an output 35 for providing a single-ended video output signal current.

A pair of buffer amplifiers 10 and 20 are provided for coupling the first and second differential video input signals, S1 and S2 (applied to respective inputs 1 and 2) to respective inputs 31 and 32 of the differential transconductance amplifier 30 via respective diode switches CR1 and CR2.

As an aside, and explained in detail later, the diode switches CR1 and CR2 provide the dual functions of (i) coupling the differential input signals S1 and S2 to the inputs 31 and 32 of amplifier 30 when power (+12 Volts) is applied to the bus reciever and (ii) decoupling the input signals otherwise. Advantageously, this extends the positive input signal voltage range of the bus receiver under power-down conditions beyond the Vber characteristics of the transistors (Q1 and Q2) used in the buffer amplifiers 10 and 20.

An output circuit (50 in FIG. 1, 70 in FIG. 2) provides the dual functions of (i) regulating the output voltage of the differential transconductance amplifier at a substantially constant voltage and (ii) converting said output current to an output voltage. For this purpose, as explained in detail later, the output circuit includes a load resistor (R15) having a resistance value greater than the reciprocal of the transconductance, gm, of the amplifier 30 by a predetermined amount.

Figure 2:
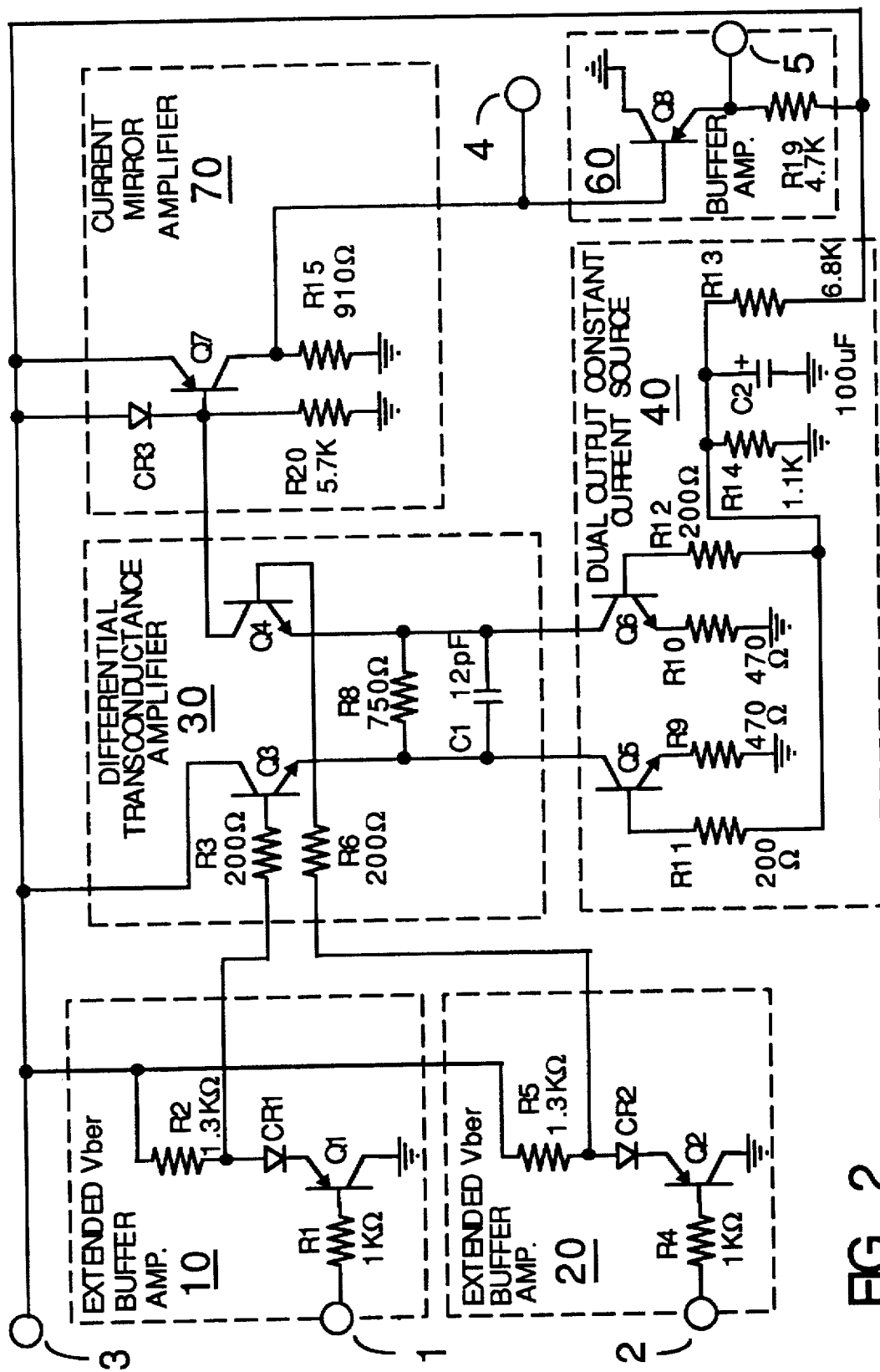
FIG. 2 illustrates a modification of the video differential bus receiver of FIG. 1.

The video bus receiver of FIGS. 1 and 2 also includes a video output signal buffer amplifier 60 (optional) for providing buffered video output signals and an exemplary dual output constant current source 40 that is suitable for supplying equal values of operating currents I1 and I2 to the differential transconductance amplifier 30.

In more detail, the differential transconductance amplifier 30 comprises a pair of NPN transistors Q3 and Q4 to which the differential video signals S1 and S2 are applied from buffers 10 and 20 via respective base input resistors R3 and R6. These resistors provide the functions of limiting input transients as well as attenuating Hre effects (e.g., "H" parameter emitter-to-base reverse current feedback) which enhances high frequency stability of the buffer amplifier.

The emitters of transistors Q3 and Q4 are connected to respective current input terminals 33 and 34 for receiving respective equal valued constant currents provided by the source 40. The emitters are also coupled by means of a transconductance control resistor R8 that determines the transconductance of amplifier 30. For the specific value of R8 illustrated (750Ω), the transconductance (gm) equals about 1334 micro-mhos single-ended. Since the input signals are differential, the transconductance may be doubled (2668 micro-mhos) for calculation of the overall gain or the single ended value may be used if 6 dB is added to the gain calculation. The overall bus receiver gain calculation, however, must be modified to include buffer amplifier losses as discussed later.

Another factor affecting the transconductance of amplifier 30 is provided by a capacitor C1 connected in parallel with the transconductance control resistor R1. This capacitor provides a transconductance increase at higher frequencies or "transconductance peaking". For the specific circuit element values shown, the time constant equals about 9 nano-Seconds which provides a transconductance boost beginning at a frequency of about 17 MHz. This boost, if used, is useful in compensating for bandwidth degrading effects such as alpha-rolloff of the bus receiver transistors and stray capacitances which tend to degrade the overall frequency response. In addition to improving the high frequency response of the overall bus receiver, it has been found that the inclusion of a capacitor in parallel with the "gm" control resistor R8 also provides a desirable extension of the overall common mode rejection range to higher frequencies.

The collector of transistor Q3 is connected to the supply terminal 3 for receiving a constant supply voltage (illustratively, +12 volts as shown) and the collector of transistor Q4 is connected to a collector voltage regulator which is one of the functions of the common base amplifier 50 in the example of FIG. 1 and by current mirror amplifier 70 in the example of FIG. 2. In addition to regulating the output voltage of the differential transconductance amplifier at a constant value, the common base amplifier 50 ( or the current mirror amplifier 70) provides the additional function of a current to voltage converter for deriving an output video signal voltage from the transconductance amplifier 30.

In more detail, common base amplifier 50 includes resistors R17 and R18 coupled in series from the supply terminal 3 to ground thereby forming a potential divider. For the exemplary values shown, this divider produces an output voltage of about 10.3 volts from the 12 volt supply. This voltage is filtered by capacitor C3 coupled in parallel with resistor R17 and applied via resistor R16 to the base of common base connected PNP transistor Q7. Assuming a nominal 600 millivolt Vbe for transistor Q7, this regulates the emitter voltage of transistor Q7 (and this the collector voltage of the transconductance amplifier transistor Q4) at a voltage of about 10.9 volts. Since this voltage is regulated and can not vary, the current through the emitter load resistor will be a constant current of about 4 milli-Amps (for the values shown) and the collector current of the common base amplifier transistor Q7 will thus equal 4 milli-Amps minus the output current of the differential transconductance amplifier 30. Since the quiescent current of the differential transconductance amplifier is about 2 mA, the quiescent output voltage produced by load resistor R15 of transistor Q7 is about 1.8 volts for the exemplary value shown.

The differential voltage gain produced by the overall bus receiver equals the product of the transconductance of amplifier 30 times the value of load resistor R15 minus the losses of the input buffer amplifiers 10 and 20. By making load resistor R15 slightly larger than the transconductance control resistor R8, the losses of the input buffers can be effectively cancelled yielding a net differential gain of 0 dB for the overall circuit.

The buffer amplifier 10 comprises a PNP emitter follower connected transistor Q1 having a grounded collector, having a base coupled to input 1 via a protection resistor and having an emitter coupled to the cathode of a diode CR1 which serves as a switch. The anode of CR1 is coupled directly to input terminal 31 of amplifier 30 and via emitter load resistor R2 to the positive supply terminal 3. Resistors R4 and R5, diode CR2 and PNP transistor Q2 of buffer amplifier 20 are connected as the corresponding circuit elements in buffer amplifier 10.

The buffer amplifiers 10 and 20 provide several functions including (i) providing a relatively high input impedance for the bus receiver to facilitate video line bridging operation, (ii) providing a relatively low and balanced source impedance for the differential stage to enhance the common mode rejection and (iii) the PNP configuration facilitates extending the common mode input voltage range to essentially ground level. This latter feature, however, subjects the input buffer transistors to a potential problem with regard to Vber characteristics.

The basis of the Vber problem is that conventional small signal high frequency transistors have a reverse voltage base-emitter diode breakdown voltage (Vber) on the order of five volts or so. Recall that the buffer amplifier requirements include not loading the video bus under power down conditions and the video bus common mode voltage is 5 volts plus or minus 2 volts. If diodes CR1 and CR2 were not provided to decouple transistors Q1 and Q2 under power down conditions, then the video bus signal at the maximum common mode level of 7 volts could easily exceed a Vber of 5 volts thus placing a load on the video bus. This, of course, is directly contrary to the requirement that the bus not be loaded under power down conditions of the video bus receiver.

While the use of diode switches CR1 and CR2 for disconnecting the buffer amplifiers during power down conditions desirably prevents loading of the video bus connected to terminals 1 and 2 when power is off, it also introduces some signal loss during normal operation. This loss occurs because when biased on, the diodes may exhibit an appreciable "on" resistance and being in series with emitter resistors R2 and R5 there will be a potential divider or attenuator action. Generally, the diode and resistor attenuation will be relatively small. However, for precise determinations of gain this signal loss is corrected scaling the values of the transconductance control resistor and the output signal load resistor such that R15 (the load resistor) is slightly larger than R8, the "gm" control resistor. For the exemplary values shown resistor R15 is about 1.2 times the value of resistor R8. TMs provides sufficient excess gain (about 1.6 dB) to compensate for the switch (CR1, CR2) losses and all other overall bus receiver losses.

The dual output constant current source 40 includes resistors R13 and R14 connected in series between supply terminal 3 and ground to form a potential divider. The voltage so produced (about 1.67 volts for the element values shown) is smoothed by a capacitor C2 and coupled to respective base electrodes of current source transistors Q5 and Q6 via respective protection resistors R11 and R12. The emitters of transistors Q5 and Q6 are coupled to ground via respective resistors R9 and R10. For the element values shown, with 1.67 volts at the base electrodes provided by the potential divider R13–R14 and assuming a 600 milli-Volt Vbe, the emitter voltages will be about 1.07 volts across the emitter resistors R9 and R10. Thus each resistor will conduct a constant current of about 2 mA and this amount of current will be supplied to the current input terminals 33 and 34 of the differential transconductance amplifier 30.

The video output signal voltage produced across resistor R15 is applied to an output terminal 4 for application to external devices of relatively high input impedance (e.g., substantially greater than the value of resistor R15). For lower input impedance loads, the output signal from resistor R15 may be coupled to an output terminal 5 via a buffer amplifier 60 which, in this example, comprises a PNP emitter follower transistor Q8 having a grounded collector, a base coupled to resistor R15 and an emitter coupled directly to the output terminal 5 and coupled to ground via an emitter resistor R19. In operation the emitter follower exhibits a voltage gain of substantially unity and reduces the output impedance for driving external loads.

In the example of FIG. 1 the common base amplifier 50 functions in some respects as a "current mirror amplifier" to reflect the signal current from the collector of transistor Q4 back to ground through the load resistor R15. An alternative is to use a current mirror amplifier and bias current source as shown in FIG. 2. There the collector of transistor Q4 (the output of the differential transconductance amplifier 30) is applied to the cathode of a diode CR3 and to the base of the PNP transistor Q7 the collector of which is coupled to ground via load resistor R15 as in the previous example. The emitter of transistor Q7 and the anode of diode CR3 are both coupled to the positive supply terminal thus forming a PNP type of current mirror amplifier. To provide a common mode output current to the load resistor R15, the input of the mirror 70 (i.e., CR3) is coupled to ground via a resistor R20. For the illustrative value of supply voltage and resistance, resistor R20 will supply about 2 mA to the mirror which will then supply an output current to load resistor R15 equal to 2 mA plus the differential output current of amplifier 30.

In considering the operation of the current mirror amplifier 70 as compared with the common base amplifier 50 it will be noted that both circuits develop a voltage across the load resistor R15 relative to ground potential. This is desirable to avoid introducing power supply voltage dependence on the output signal and thus maintains good power supply rejection. If the current mirror amplifier 70 has a current gain of unity, then the overall gain will be the same as in the previous example using the common base amplifier. More specifically, the overall voltage gain of the example of FIG. 2 equals the product of the transconductance of amplifier 30 times the load resistance of mirror 70 times the current gain of mirror 70 plus 6 dB minus the loss of the input buffer amplifiers 10 and 20. This gain calculation differs from that of FIG. 1 only in the inclusion of the current gain term for the mirror 70. This term does not appear in the calculation for FIG. 1 since the current gain of the common base amplifier is unity.

The use of a common base amplifier such as amplifier 50 is preferred over the use of a current mirror amplifier (e.g., amplifier 70) in a bus receiver applications for two reasons. First a variable voltage is developed across diode CR3 due to signal current variations and thus subjects transistor Q4 of the differential transconductance amplifier to some degree of the Miller effect. By contrast, use of a common base amplifier, such as amplifier 50, provides a very high degree of voltage regulation at the collector of transistor Q4 and so there will be no significant Miller feedback effects to the transconductance amplifier 30.

A second benefit of using a common base amplifier, rather than a current mirror amplifier, as the voltage-to-current converter for the differential transconductance amplifier 30 is that the common base amplifier gain is precisely known and very close to unity. By contrast, the gain of a current mirror amplifier depends upon relative junction areas if the CMA has no degeneration resistors thus making the gain calculation uncertain. If, on the other hand, one attempts to stabilize the gain of a CMA using emitter degeneration resistors, the result will be an increase in input impedance which has the undesirable consequence of making the Miller effect worse, thus reducing the overall frequency response at high frequencies.

What is claimed is:

1. Differential to single-ended video bus receiver apparatus, comprising:
    a differential transconductance amplifier having a fixed value of transconductance and an output for providing a video output signal current proportional to said transconductance and to a difference between first and second differential video-input signals supplied thereto;
    a pair of buffer amplifiers for coupling the differential video input signals to respective inputs of said differential transconductance amplifier via respective diode switches; and
    an output circuit for regulating said output of said differential transconductance amplifier at a substantially fixed voltage and for converting said output signal current to an output signal voltage.

2. Apparatus as recited in claim 1 wherein:
    said bus receiver includes a power supply terminal: and
    said diode switches are biased to provide closed circuit paths for said differential video signals when power is applied to said supply terminal and to provide open circuit paths otherwise.

3. Apparatus as recited in claim 1 wherein said output circuit comprises a common base amplifier having an input connected to said output of said transconductance amplifier for receiving said video output signal current and coupled also to a source of quiescent operating current, said common base amplifier having an output coupled to a load for developing said output signal voltage.

4. Apparatus as recited in claim 1 wherein each said buffer amplifier comprises a PNP transistor having a base to which one of said video input signals is applied, having a grounded collector and having an emitter coupled to a source of supply voltage via one of said diode switches and a load resistor.

5. Apparatus as recited in claim 1 wherein said differential transconductance amplifier comprises:
    first and second transistors having respective base electrodes coupled to receive said first and second differential video input signals, having respective emitter electrodes coupled to receive respective emitter currents and coupled together via a transconductance control resistor, the first transistor having a collector coupled to a source of supply voltage and said second transistor having a collector coupled to an output terminal of said differential transconductance amplifier.

6. Apparatus as recited in claim 1 wherein said differential transconductance amplifier includes a transconductance control resistor and a transconductance peaking capacitor coupled in parallel between emitter electrodes of first and second transistors having base electrodes to which said differential video input signals are applied, each transistor having a collector electrode coupled to receive respective and nearly equal constant voltages.

7. Video differential to single-ended video bus receiver apparatus, comprising:

a differential transconductance amplifier having first and second inputs for receiving respective differential input signals and having an output for providing an output current proportional a difference of the differential input signals and inversely proportional to the value of a transconductance control resistor in said differential transconductance amplifier;

a pair of buffer amplifiers for coupling respective ones of said first and second differential input signals to respective ones of the inputs of the differential transconductance amplifier, each buffer amplifier including a diode connected to provide an extended positive input voltage range beyond a maximum value of a Vber characteristic of an associated input buffer transistor; and an output circuit coupled to said output of the differential transconductance amplifier, for regulating said output current of the differential transconductance amplifier at a substantially fixed value and including a load resistor for converting said output current of said differential transconductance amplifier into an output voltage proportional to the output current.

8. Apparatus as retired in claim 7 wherein said output circuit comprises:

a common base amplifier having an input coupled to receive said output current of said differential transconductance amplifier and a quiescent current supplied thereto and having an output coupled to a source of reference potential via said load resistor for producing said output signal voltage.

9. Apparatus as recited in claim 7 wherein said output circuit comprises a current mirror amplifier having an input coupled to receive said output current of said transconductance amplifier and a quiescent bias current supplied thereto and having an output coupled to a point of reference potential via said load resistor.

* * * * *